(12) United States Patent
Gaudin et al.

(10) Patent No.: US 11,239,108 B2
(45) Date of Patent: Feb. 1, 2022

(54) METHOD FOR PRODUCING A DONOR SUBSTRATE FOR CREATING A THREE-DIMENSIONAL INTEGRATED STRUCTURE, AND METHOD FOR PRODUCING SUCH AN INTEGRATED STRUCTURE

(71) Applicant: Soitec, Bernin (FR)

(72) Inventors: Gweltaz Gaudin, Crolles (FR); Didier Landru, Le Champ-près-Froges (FR); Bruno Ghyselen, Seyssinet (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 17/043,480

(22) PCT Filed: Mar. 22, 2019

(86) PCT No.: PCT/FR2019/050653
§ 371 (c)(1),
(2) Date: Sep. 29, 2020

(87) PCT Pub. No.: WO2019/186035
PCT Pub. Date: Oct. 3, 2019

(65) Prior Publication Data
US 2021/0057268 A1  Feb. 25, 2021

(30) Foreign Application Priority Data

Mar. 29, 2018 (FR) ...................................... 1852751

(51) Int. Cl.
*H01L 21/00* (2006.01)
*H01L 21/762* (2006.01)
*H01L 21/768* (2006.01)

(52) U.S. Cl.
CPC .. *H01L 21/76254* (2013.01); *H01L 21/76205* (2013.01); *H01L 21/76814* (2013.01)

(58) Field of Classification Search
None
See application file for complete search history.

(56) References Cited

U.S. PATENT DOCUMENTS

2016/0197006 A1  7/2016  Broekaart et al.
2019/0088462 A1*  3/2019  Guenard .............. H01L 41/083

FOREIGN PATENT DOCUMENTS

WO  2013/045985 A1  4/2013
WO  2017/012940 A1  1/2017

OTHER PUBLICATIONS

International Search Report for International Application No. PCT/FR2019/050653 dated Jun. 7, 2019, 2 pages.
(Continued)

*Primary Examiner* — Reema Patel
(74) *Attorney, Agent, or Firm* — TraskBritt

(57) ABSTRACT

A process for producing a donor substrate for creating a three-dimensional integrated structure comprises the following steps: providing a semiconductor substrate comprising a surface layer, referred to as an active layer, and a layer comprising a plurality of cavities extending beneath the active layer, each cavity being separated from an adjacent cavity by a partition, forming an electronic device in a region of the active layer located plumb with a cavity, depositing a protective mask on the active layer so as to cover the electronic device while at the same time exposing a region of the active layer located plumb with each partition, and implanting atomic species through regions of the active layer exposed by the mask to form a weakened zone in each partition.

20 Claims, 8 Drawing Sheets

(56) References Cited

OTHER PUBLICATIONS

International Written Opinion for International Application No. PCT/FR2019/050653 dated Jun. 7, 2020, 5 pages.

* cited by examiner

METHOD FOR PRODUCING A DONOR SUBSTRATE FOR CREATING A THREE-DIMENSIONAL INTEGRATED STRUCTURE, AND METHOD FOR PRODUCING SUCH AN INTEGRATED STRUCTURE

CROSS-REFERENCE TO RELATED APPLICATIONS

This application is a national phase entry under 35 U.S.C. § 371 of International Patent Application PCT/FR2019/050653, filed Mar. 22, 2019, designating the United States of America and published as International Patent Publication WO 2019/186035 A1 on Oct. 3, 2019, which claims the benefit under Article 8 of the Patent Cooperation Treaty to French Patent Application Serial No. 1852751, filed Mar. 29, 2018.

TECHNICAL FIELD

The present disclosure relates to the fabrication of a substrate referred to as a "donor substrate" for the production of a three-dimensional integrated structure of semiconductor-on-insulator type. The present disclosure also relates to a process for fabricating such a three-dimensional integrated structure, which is formed of a stack of layers, and, in particular, of layers provided with electronic devices, by transfer of a layer of the donor substrate to a second substrate, referred to as a "receiver substrate."

BACKGROUND

A three-dimensional integrated structure, in particular, of semiconductor on insulator (SeOI) type, in particular, of silicon on insulator (SOI) type when the semiconductor material is silicon, comprises a stack of several layers, including, in particular, layers in which electronic devices or circuits referred to as "active layers" are formed. The processes for fabricating such integrated structures are typically designated as three-dimensional (3D) integration processes.

Among the possible integration processes, 3D integration by layer transfer from a donor substrate to a receiver substrate presents itself as being a promising solution for stacking active layers.

In accordance with this type of process, a "weakened" zone is created in the donor substrate, which zone delimits a layer to be transferred, the donor substrate is bonded to the receiver substrate, then the donor substrate is detached along the weakened zone, so as to transfer the layer to the receiver substrate.

One well-known layer transfer process is the Smart Cut™ process, in which the weakened zone is created by implantation of hydrogen and/or helium atoms in the donor substrate at a predetermined depth, which corresponds substantially to the thickness of the layer to be transferred.

The Smart Cut™ process is advantageous since it makes it possible to reuse the donor substrate after transfer of the layer for other subsequent applications, and makes it possible to transfer thin layers uniformly.

Attempts at implanting ions at great depth have been carried out in order to transfer, in accordance with the Smart Cut™ process, very thick active layers, by increasing the implantation energy. However, the higher the implantation energy, the larger the amount of ions to be implanted must be, and the lower the implantation current (current density), which leads to an increase in production costs and limits the feasibility of the process.

Furthermore, the ion implantation is carried out by exposing the active face of the donor substrate containing the electronic devices to ionic radiation. This radiation causes damage to the electronic devices of the active layer, and it is therefore necessary to provide additional steps that aim to repair the damaged electronic devices. The damage caused to the electronic devices is even greater when the implantation energy and the amount of ions to be implanted are high.

To preserve the electrical properties of the electronic devices, it would be conceivable to apply a thermal budget in order to remove the hydrogen and activate the doping. However, in this case, the temperature must be above 700° C., which is not compatible with the fabrication of a 3-D structure by stacking active layers. It has been envisaged to carry out solid-phase epitaxial growth in order to reduce the thermal budget. It is thus possible to arrive at a temperature slightly above 525° C. in the case of epitaxy of silicon, which remains high. It is possible to further reduce the thermal budget in order to attain a temperature of the order of 475° C., at the expense of the thermal annealing time, which then increases very greatly and becomes significantly longer than 24 hours, which is not compatible with industrial production rates.

The total thickness of the stacks of the electronic devices on the front face and on the rear face will be limited, since it will have to be less than the penetration depth of the ions. This then results in a very small total thickness, less than or equal to around 1 or 2 micrometers, even when the ions used have a high energy level.

Furthermore, the layers to be stacked comprise silicon layers, but also dielectric and metal layers. Carrying out a sufficiently deep ion implantation therefore requires a high energy and a very large amount of implanted ions in order to enable a good detachment of the donor substrate at a later stage. Yet, given that the ion implantation current may decrease accordingly with the energy, the duration of the ion implantation necessary for the detachment of the donor substrate and for the transfer of an active layer is very high, which is a major drawback for carrying out such a process.

Lastly, the implantation depth of the ions depends on the physicochemical characteristics of the active layers, which may slow down the ions to a greater or lesser extent during the ion implantation. For example, the active layers may differ in the arrangement of the metal layers that they contain, certain zones containing metal and others not, which has an influence on the behavior of the ions that pass through these zones of the active layers. This leads to the formation of a discontinuous weakened zone and thus to a poor detachment of the donor substrate along this weakened zone.

Other transfer techniques can also be used.

Among these, the stacking of chips of various functions or "chip stacking" consists, starting from a thin substrate, in bonding the chips to the substrate by stacking them one on the other in order to form a 3-D structure then interconnecting the chips and the substrate by means provided for this purpose such as by wiring or by use of layers of silicon inserted between two chips. A multifunctional 3D structure is thus obtained owing to the various functions of the assembled chips.

The main drawback of this technique, besides its high cost, is that the alignment of the chips thus assembled is not optimal (typically <0.5 µm, 200 nm 3σ). It is therefore necessary to provide contacts or connections between the chips and the substrate having a high diameter, which results in electrical losses, and limits the integration options.

3D sequential stacking involves transferring a layer of silicon to an active layer in order to be able to fabricate new electronic devices on those of the underlying active layer. In this case, the alignment of the layers is only limited by the lithography technique used, and may be very precise, of the order of a nanometer. The various active layers transferred forming the 3D structure are then interconnected. This technique makes it possible to reduce the number of lithography layers and interconnection layers compared to the "chip stacking" described previously.

A major drawback of this technique is that the process for fabricating new electronic devices must be compatible with the characteristics of the underlying active layer, in particular, by preserving the integrity thereof, which may limit the performances both of the new electronic devices and of the electronic devices of the underlying active layer.

The 3D stacking of electronic devices or "3D device stacking" is similar to the 3D sequential stacking described previously and makes it possible to obtain a relatively precise alignment of the layers that is generally less than a micrometer (typically <0.5 µm, 200 nm 3σ).

One drawback of this technique is that the stacked active layers are not uniform. The use of an SOI donor substrate makes it possible, however, to improve this situation, but at the expense of additional costs. Moreover, the removal (generally by grinding) of a portion of the donor substrate may damage the components of the active layer of the receiver substrate.

Furthermore, irrespective of the nature of the donor substrate, this substrate can no longer be reused after the implementation of the process since it has been partially ground. This constitutes a major drawback of the known techniques, since it is necessary to change donor substrate for each transfer, which has a substantial financial impact in addition to increasing the fabrication time of the 3D structure.

BRIEF SUMMARY

One objective of the present disclosure is to propose a process for fabricating a donor substrate for the production of a three-dimensional (3D) integrated structure, in particular, of semiconductor on insulator type, formed from a stack of layers equipped with electronic devices, and also a process for fabricating such an integrated structure by transfer of an active layer from a donor substrate to a receiver substrate, that makes it possible to avoid the experimental constraints inherent to the existing processes, in particular, processes described above.

The proposed fabrication processes aim more particularly to produce a 3D structure by stacking active layers provided with electronic devices, without degrading the structure and the mechanical properties of the electronic devices.

The proposed processes further aim to produce a 3D structure while enabling the reuse of the donor substrate for transferring other active layers or portions of active layer.

The proposed processes also aim to enable the transfer of very thick active layers, i.e., of 1 µm (micrometer) to a few micrometers, and very particularly to make the Smart Cut™ process compatible with the transfer of very thick active layers.

For this purpose, the present disclosure provides a process for fabricating a donor substrate for the production of a three-dimensional integrated structure, comprising the following steps:
 providing a semiconductor substrate comprising a surface layer, referred to as an active layer, and a layer comprising a plurality of cavities extending beneath the active layer, each cavity being separated from an adjacent cavity by a partition,
 forming an electronic device in a region of the active layer located plumb with a cavity,
 depositing a protective mask on the active layer so as to cover the electronic device while exposing a region of the active layer located plumb with each partition,
 implanting atomic species through the regions of the active layer exposed by the mask, to form a weakened zone in each partition.

The present disclosure also relates to a process for fabricating a three-dimensional integrated structure, formed of a stack of active layers provided with electronic devices, by transfer of a layer from a donor substrate to a receiver substrate, the process being mainly characterized in that it comprises the following steps:
 fabricating the donor substrate by the preceding fabrication process,
 bonding the donor substrate to the receiver substrate, the surface of the donor substrate opposite the weakened zones relative to the active layer to be transferred being at the bonding interface, and
 detaching the donor substrate along the weakened zones in order to transfer at least one portion of the active layer to the receiver substrate.

According to other aspects, the preceding fabrication processes have the following various features, taken alone or in technically feasible combinations thereof:
 prior to implantation of atomic species to form a weakened zone in the partitions, a selective etching of the active layer is carried out to remove at least one portion of the active layer located plumb with a partition;
 prior to the implantation of atomic species to form a weakened zone in the partitions, trenches that extend in the partitions beyond the cavities are additionally produced so as to isolate at least one cavity from the other cavities;
 before the deposition of the protective mask, an additional layer is deposited that forms an excess thickness on an active layer portion located plumb with the isolated cavity;
 the detachment of the donor substrate is carried out along the weakened zones formed by implantation of atomic species in partition parts resulting from the formation of the trenches, and the active layer portion located plumb with the isolated cavity is selectively transferred to the receiver substrate;
 the semiconductor substrate is fabricated by the implementation of the following steps:
  producing a plurality of cavities at the surface of a substrate to form the layer comprising the cavities,
  transferring the active layer to the substrate to seal the cavities;
 the cavities are formed by dry etching and/or wet etching;
 the cavities are hollow;
 the cavities are formed by an electrochemical treatment;
 the cavities are formed by the implementation of the following steps:

depositing a protective mask on a free surface of a substrate, the protective mask being positioned so as to make covered surface portions and uncovered surface portions, implanting atomic species in the substrate plumb with the surface portions not covered by the protective mask, of the implantation zones by exposing the face of the substrate covered with the mask to an incident flux of atomic species, carrying out a thermal annealing of the substrate in order to form cavities at the implantation zones;

each cavity consists of a porous medium having a porosity greater than or equal to 20%, preferably greater than or equal to 30%, relative to the total volume of the cavity;

the active layer is transferred to the cavity-containing layer by the implementation of the following steps:

implanting atomic species to form a weakened zone in a second donor substrate made of semiconductor material, in order to delimit a layer of semiconductor material to be transferred, bonding the second donor substrate to the cavity-containing layer of the donor substrate, the surface of the layer to be transferred opposite the weakened zone relative to the layer to be transferred being at the bonding interface, detaching the second donor substrate along the weakened zone in order to transfer the layer of semiconductor material to the substrate.

The present disclosure also relates to a donor substrate comprising an active layer intended to be transferred to a receiver substrate. The donor substrate is mainly characterized in that it comprises:

a layer comprising cavities, which extend in the thickness of the donor substrate and which are delimited by partitions, an active layer located on the cavity-containing layer, comprising at least one electronic device, each electronic device being arranged in a region of the active layer located plumb with a cavity, weakened zones in at least one part of the partitions separating the cavities.

BRIEF DESCRIPTION OF THE DRAWINGS

Other advantages and features of the present disclosure will become apparent on reading the following description given by way of illustrative and nonlimiting example, with reference to the appended figures, in which.

DETAILED DESCRIPTION

A first subject of the present disclosure relates to a process for fabricating a donor substrate for the production of a three-dimensional integrated structure. The donor substrate is obtained from a semiconductor substrate, one embodiment of which is represented in FIG. 1.

Figure 1:
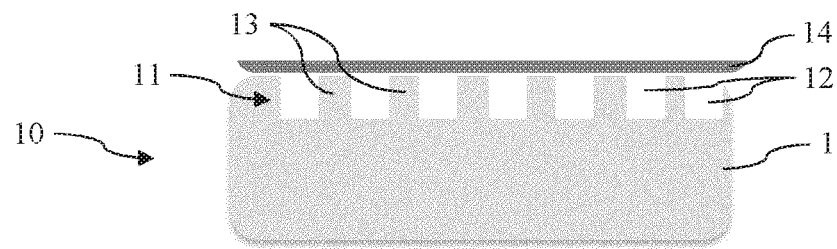
FIG. 1 is a schematic cross-sectional view of a substrate of "cavity silicon on insulator" (C-SOI) type, i.e., a substrate of SOI type provided with cavities, according to one embodiment, comprising a layer comprising cavities on which an active layer is deposited.

With reference to FIG. 1, the semiconductor substrate 10 comprises a substrate 1, a layer 11 comprising a plurality of cavities 12, and an active layer 14 positioned on the layer 11 comprising the cavities so as to cover the cavities 12.

The cavities 12 are regions of the substrate having a lower density than that of the rest of the substrate. The cavities may be hollow or consist of a porous medium. The cavities 12 extend into the thickness of the substrate 10 between a first depth (corresponding, in the example illustrated, to the upper surface of the substrate 1) and a second greater depth, and are separated from one another by partitions 13.

The substrate 1, or at least the portion of substrate in which the cavities are produced, is fabricated from a crystalline semiconductor material, such as, for example, silicon, germanium, and alloys thereof, and also III/V semiconductor compounds comprising, by definition, at least one element from group III and at least one element from group V of the Periodic Table of the Elements.

The cavities 12 represented schematically in FIG. 1 have a square or rectangular cross section in a plane parallel to the main surface of the substrate, and form cubic or parallelepipedal volumes in the substrate. It will however be understood that the cavities may optionally be in other shapes.

The cavities 12 are separated from one another by partitions 13, which correspond to portions of the substrate 1 having a greater density, for example, the natural density of the material constituting the substrate 1. The partitions 13 therefore have a shape complementary to that of the cavities 12.

Preferably, the cavities do not open onto the edge of the substrate, in order to avoid any untimely fracture initiation.

The active layer 14 is arranged on the layer 11 comprising the cavities and covers the cavities 12. In other words, the cavities 12 are closed, each cavity being delimited in the thickness direction of the substrate by a portion of the active layer 14 and by the substrate 1, and in a direction parallel to the exposed surface of the substrate by two adjacent partitions 13.

Figure 2:
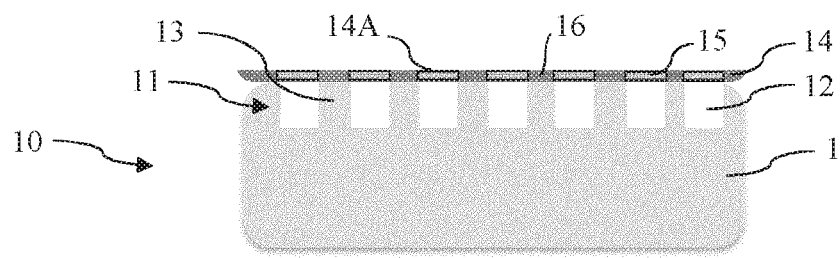
FIG. 2 is a schematic cross-sectional view of the substrate from FIG. 1, in which electronic devices have been produced on the active layer.

Starting from the semiconductor substrate 10 described above, electronic devices 15 are formed in regions 14A of the active layer 14 that are located plumb with the cavities 12, as FIG. 2 illustrates. Preferably, an electronic device 15 is formed conventionally in each of the regions 14A of the active layer 14 located plumb with a respective cavity 12.

The electronic devices 15 do not however extend into the regions 16 located plumb with the partitions 13.

The fact of producing electronic devices on the semiconductor substrate (intended to form the donor substrate) before bonding it to the receiver substrate, makes it possible to avoid the constraints limiting the thermal budget for producing these electronic devices, unlike the processes known from the prior art in which the electronic devices are produced only after transfer of the active layer to a receiver substrate. Specifically, in the processes known from the prior art, the thermal budget for forming the electronic devices on the transferred active layer is limited in order not to degrade electronic devices already present in the receiver substrate.

Figure 3:
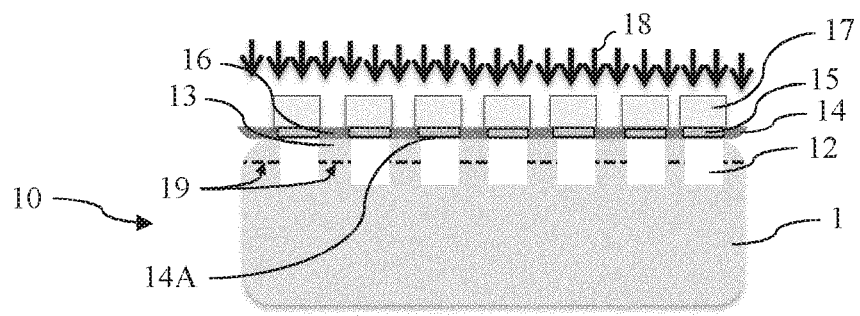
FIG. 3 is a schematic cross-sectional view of the substrate from FIG. 1, in which an implantation of atomic species is carried out in order to form weakened zones, with prior deposition of a protective mask on the electronic devices of the active layer, in order to form a donor substrate.

A protective mask 17 is then deposited on the active layer. This step is represented in FIG. 3. The protective mask 17 is deposited so as to cover the electronic devices 15, while exposing the regions 16 of the active layer located plumb with the partitions. Thus, the regions 14A of the active layer 14 that are located plumb with the cavities comprise an electronic device 15 surmounted by a portion of protective mask 17.

The protective mask may be a resist or else a solid mask, for example, based on oxide or on nitride.

Still with reference to FIG. 3, the surface of the substrate on which the mask was deposited is then exposed to a flux 18 of atomic species.

The atomic species penetrate into the substrate 10 via the surface exposed regions of the active layer, and are implanted in the underlying partitions 13, at a depth determined by the implantation parameters. The atomic species form a weakened zone 19 in each partition, and all of the weakened zones, depicted in FIG. 3 by dotted lines, delimit a surface layer intended to be transferred later to a receiver substrate.

The atomic species that encounter the protective mask are themselves blocked by the mask and do not penetrate into the substrate.

Preferably, the atomic species implanted are hydrogen ions and/or helium ions.

A person skilled in the art is able to determine the implantation parameters, in particular, the nature of the atomic species, the dose and the energy of the species, in order to implant the atomic species at the desired depth in the partitions.

The fact that the implantation is carried out after the formation of the electronic devices in the active layer makes it possible to avoid an untimely fracture of the donor substrate along the weakened zones. Specifically, the formation of the electronic devices uses thermal budgets that would be likely to initiate a fracture in a weakened zone formed beforehand.

Thus, after removal of the mask, a donor substrate 20 is obtained that is used for the transfer of the active layer 14 to a receiver substrate, in accordance with the second subject of the present disclosure described hereinafter.

A second subject of the present disclosure relates to a process for fabricating a three-dimensional integrated structure from a donor substrate as described above.

Figure 4:
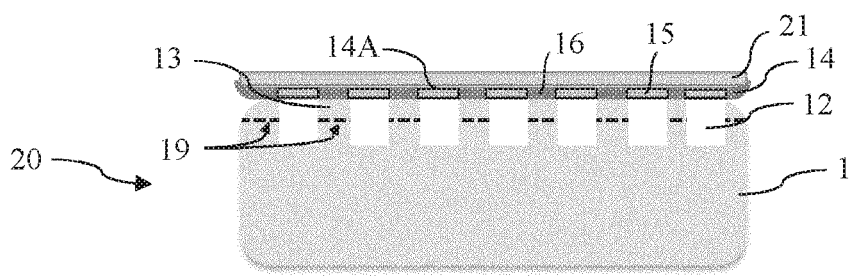
FIG. 4 is a schematic view of the donor substrate from FIG. 3 with an oxide layer deposited on the active layer.

An optional first step of this process involves depositing an oxide layer 21 on the active layer 14 to be transferred of the donor substrate 20, so as to cover the electronic devices 15. The deposition of the oxide layer 21 is represented in FIG. 4. This oxide layer referred to as "buried oxide layer" (BOX) is found, after subsequent bonding, at the bonding interface with the receiver substrate. The oxide layer makes it possible to improve the subsequent bonding of the donor substrate to a receiver substrate. It is also possible to deposit an oxide layer on the receiver substrate, or both on the donor substrate and on the receiver substrate. The deposition of an oxide layer both on the donor substrate and on the receiver substrate makes it possible to have oxide-oxide type bonding, which improves the quality of the bonding even more.

According to one embodiment, the surfaces intended for forming the bonding interface comprise portions of various natures, in order to create a so-called hybrid bonding, for example, an oxide-metal type bonding. Specifically, in order to create interconnections between the electronic devices of the stacked layers, connections may be envisaged that open onto the surface at the bonding interface, in particular, made of oxide. Thus, it is possible to have mixed bonding interface portions, such as, for example, the combination of the following mixed portions: oxide-oxide (Ox/Ox), metal-oxide (Me/Ox), metal-metal (Me/Me), oxide-metal-(Ox/Me). The metal is preferably copper.

A smoothing of the exposed surface of the oxide layer 21 may then be carried out in order to reduce the roughness thereof and to further improve the quality of the bonding. A smoothing by chemical mechanical polishing (CMP) is particularly suitable for this purpose.

The bonding of the donor substrate 20 to a receiver substrate 30 is then carried out.

Figure 5:
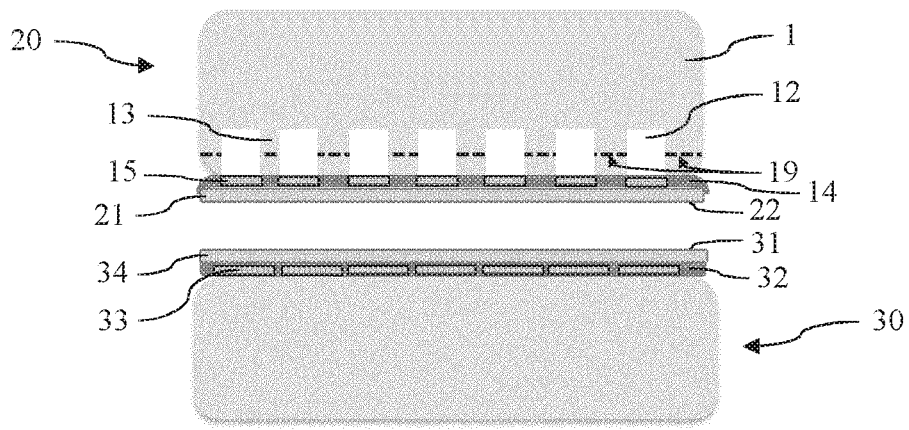
FIG. 5 is a schematic view illustrating the alignment of the donor substrate with a receiver substrate provided with an active layer.

With reference to FIG. 5, the donor substrate 20 and the receiver substrate 30 are firstly positioned facing one another. The surfaces intended to form the bonding interface, i.e., the free surface 22 of the active layer of the donor substrate and the free surface 31 of the receiver substrate, are parallel.

The receiver substrate 30 represented in FIG. 5 itself advantageously comprises an active layer 32 comprising a plurality of electronic devices 33. This active layer may have been formed on the receiver substrate during its fabrication. This active layer may have been deposited according to the present process, during a first transfer, in which case FIG. 5 illustrates the transfer of a second active layer 32 to the receiver substrate 30, according to a second iteration of the process. As will be explained in greater detail hereinafter, the process specifically aims to deposit, by means of the donor substrate, a plurality of active layers, or portions of active layers, on the receiver substrate by iteration or repetition of the steps of the process, in order to fabricate a three-dimensional integrated structure.

Figure 6:
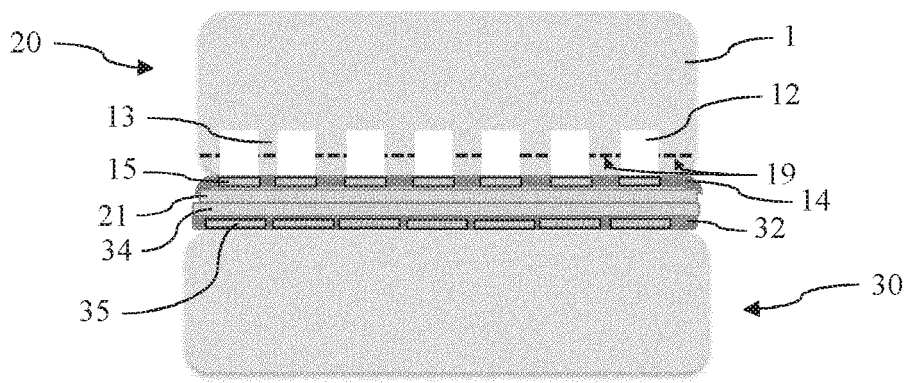
FIG. 6 is a schematic view illustrating the bonding of the donor substrate with the receiver substrate.

With reference to FIG. 6, the donor substrate 20 is bonded to the receiver substrate 30. The active layers 14, 32 of the donor substrate and of the receiver substrate, and where appropriate the oxide layers 21, 34 deposited on one and/or other of these active layers, form the bonding interface. Furthermore, the surface of the donor substrate opposite the weakened zones relative to the active layer to be transferred is at the bonding interface.

Figure 7:
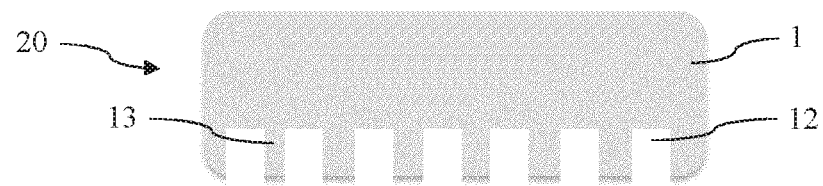
FIG. 7 is a schematic view illustrating the detachment of the donor substrate at the weakened zones.
Figure 7:
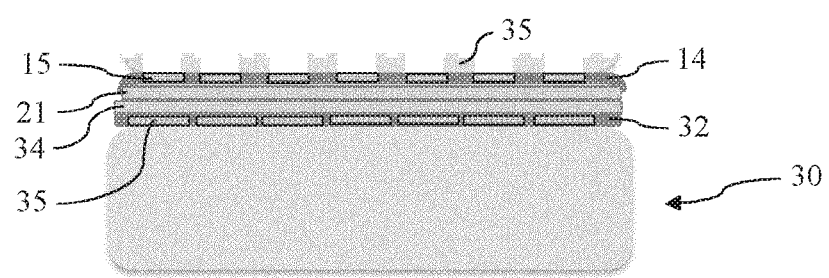

The donor substrate 20 is then detached along the weakened zones 19 and cavities 12, as represented in FIG. 7. For this purpose, a stress, for example, thermal stress, is applied to the donor substrate, which initiates then propagates a fracture in the weakened zones 19 and cavities 12, which are by nature weaker zones of the substrate. The active layer 14 of the donor substrate is thus transferred to the receiver substrate.

After separation, the donor substrate 20, provided with its layer comprising cavities, is retained. The donor substrate is consequently reusable for transferring other active layers to the same receiver substrate 30, or to a different receiver substrate, in order to produce a stack of active layers and to form an integrated structure, by repetition of the steps described above.

Given that the partitions 13 have been fractured, partition fractions 35 have also been transferred with the active layer to the receiver substrate. Consequently, the height of the partitions 13 and, respectively, the height of the cavities 12 of the donor substrate after transfer are slightly reduced, without however compromising the reuse of the donor substrate.

A treatment of the free surface of the transferred active layer is therefore preferably carried out in order to remove the partition fractions 35.

When a buried oxide layer 21 has been deposited on the donor substrate before bonding, the transferred active layer is preferentially treated by chemical etching in order to remove the partition fractions without adversely affecting the buried oxide layer. For example, a chemical etching based on tetramethylammonium hydroxide (TMAH) is suitable.

Figure 8:
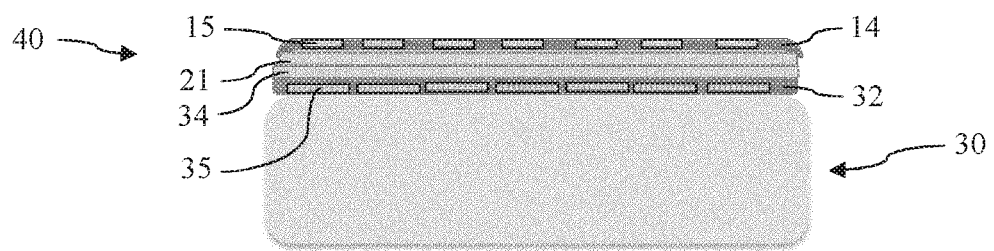
FIG. 8 is a schematic view of a 3D structure of semiconductor type obtained after removal of the detachment residues by selective etching.

The three-dimensional final structure 40 obtained is represented in FIG. 8. It comprises the receiver substrate 30 and also a stack of two active layers 14, 32, each provided with electronic devices.

The donor substrate may then be reused to carry out the transfer of a new active layer to the receiver substrate. In order to do this, a new active layer is formed on the donor substrate, which covers the cavities, then the steps of forming the electronic devices on the active layer, optionally deposition of an oxide layer, deposition of a protective mask on the electronic devices, implantation of atomic species in the partitions, bonding, and detachment of the donor substrate are repeated.

The active layer 14 is preferably transferred from a second donor substrate to the cavity-containing layer of the semiconductor substrate, according to the Smart Cut™ process (not represented).

In detail, an implementation of atomic species is carried out in order to form a weakened zone in the second donor substrate, in order to delimit the active layer to be transferred.

Next the second donor substrate is bonded to the cavity-containing layer of the substrate. During the bonding, the surface of the active layer to be transferred opposite the weakened zone relative to the layer to be transferred is at the bonding interface.

The second donor substrate is then detached along the weakened zone in order to transfer the active layer to the substrate.

The cavities 12 of the donor substrate are preferably formed according to the embodiments described hereinafter with reference to FIGS. 9A-C, 10A-C, and 11A-C.

Figure 9A:
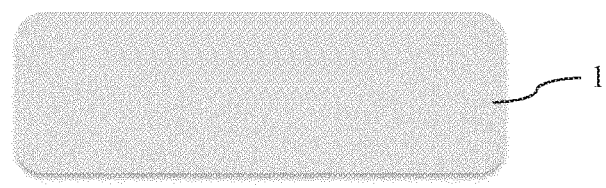
FIGS. 9A, 9B, and 9C are schematic views illustrating the fabrication according to one embodiment of a layer comprising cavities by etching on a substrate, and the deposition of an active layer on the layer comprising cavities by a Smart Cut™ process.
Figure 9B:
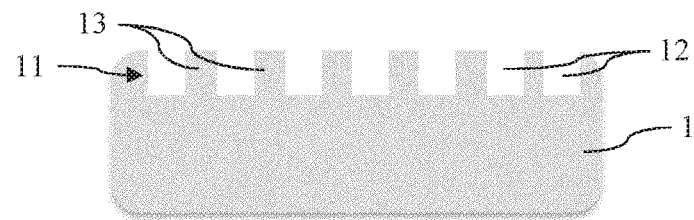

According to a first embodiment, the cavities 12 are formed in the substrate 1 represented in FIG. 9A by dry etching and/or wet etching. The substrate from FIG. 9B comprising a layer 11 provided with cavities 12 is obtained.

The etching makes it possible to obtain hollow cavities. The etching has the advantage of being commonly used in the field of the fabrication of semiconductor structures, so that the implementation thereof is relatively simple. It is specified that techniques other than etching may be suitable on condition that they make it possible to form hollow cavities.

Figure 9C:
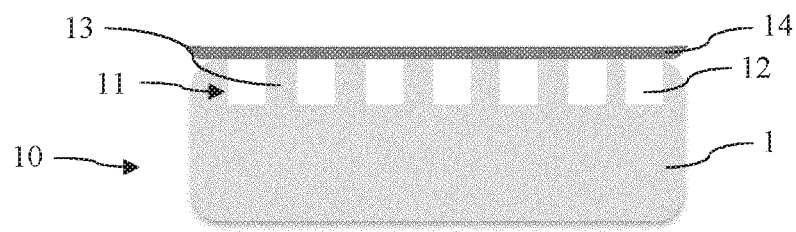

The formation of the cavities 12 is followed by the transfer of the active layer 14 so as to cover the cavities, as represented in FIG. 9C. The transfer of the active layer is preferably carried out according to the Smart Cut™ process described above.

Figure 10A:
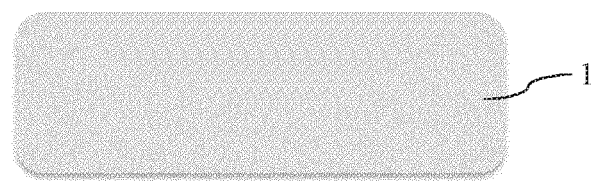
FIGS. 10A, 10B, and 10C are schematic views illustrating the fabrication according to one embodiment of a layer comprising cavities by electrochemical treatment of a substrate, and the deposition of an active layer on the layer comprising cavities by a Smart Cut™ process.
Figure 10B:
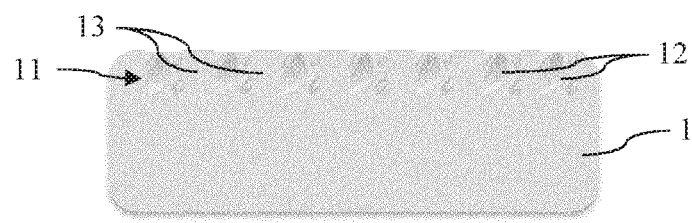

According to a second embodiment, the cavities 12 are formed in the substrate 1 represented in FIG. 10A by an electrochemical treatment. The substrate from FIG. 10B comprising a layer 11 provided with cavities 12 is obtained.

Such a treatment involves locally forming porosities by application of an electric current, and is commonly denoted by "electrochemical-porosification."

This electrochemical treatment makes it possible to obtain cavities consisting of a porous medium. The porosity of the cavities formed is preferably greater than or equal to 20%, and more preferably greater than or equal to 30%, relative to the total volume of the cavity.

Figure 10C:
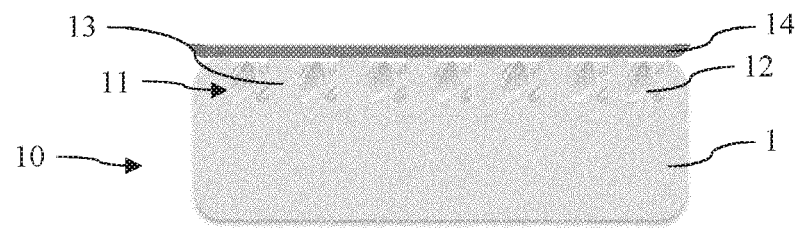

The formation of the cavities 12 is followed by the transfer of the active layer 14 so as to cover the cavities, as represented in FIG. 10C. The transfer of the active layer is preferably carried out according to the Smart Cut™ process described above.

Figure 11A:
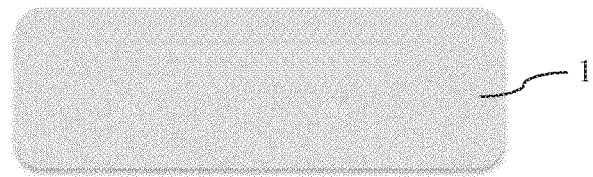
FIGS. 11A, 11B, and 11C are schematic views illustrating the fabrication according to one embodiment of a layer comprising cavities by implantation of atomic species in a substrate.

According to a third embodiment, the cavities 12 are formed in the substrate 1 represented in FIG. 11A by implantation of atomic species in the substrate.

This begins with the deposition of a protective mask 2 on a free surface of the substrate. The mask makes covered surface portions and uncovered surface portions 3.

The face of the substrate covered by the mask is then exposed to an incident flux of atomic species 4 in order to implant atomic species in the substrate. This is preferably a flux of hydrogen ions and/or of helium ions.

Figure 11B:
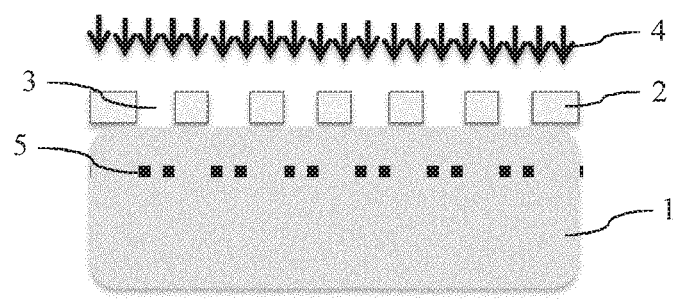

The atomic species penetrate into the substrate via the portions 3 not covered by the mask, and are implanted plumb with the uncovered zones. The atomic species implanted in the substrate are represented in FIG. 11B by dotted lines 5. The atomic species form implantation zones, spaced apart from one another, each implantation zone being intended to form a cavity.

The atomic species that encounter the protective mask are themselves blocked by the mask and do not penetrate into the substrate.

A person skilled in the art is able to determine the implantation parameters, in particular, the nature of the atomic species, the dose and the energy of the species, in order to implant the atomic species in the substrate, at the desired depth.

Figure 11C:
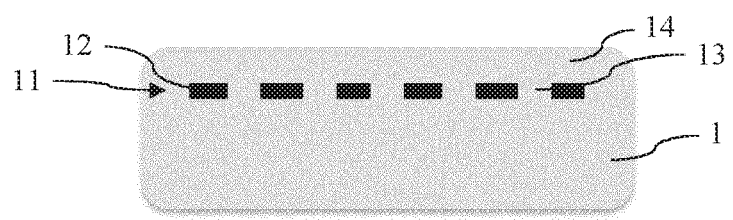

An annealing of the substrate is then carried out in order to develop the defects (platelets) created by the implantation to form cavities 12 in the implantation zones. The substrate thus obtained is represented in FIG. 11C. The cavities 12 are separated from one another by the partitions 13 located plumb with the surface portions 3, which were not covered by the protective mask 2.

Unlike the first and second embodiments, the active layer 14 is defined as being the surface layer delimited by the cavity-containing layer 11 (cf. FIG. 11C). This third embodiment does not therefore involve transfer of the active layer to the layer provided with cavities in order to fabricate the donor substrate. This makes it possible to dispense with one fabrication step and thus reduce the fabrication time of the donor substrate.

Optionally, an oxide layer as described above is then deposited on the active layer so as to cover the electronic devices, in order to improve the bonding.

Figure 12:
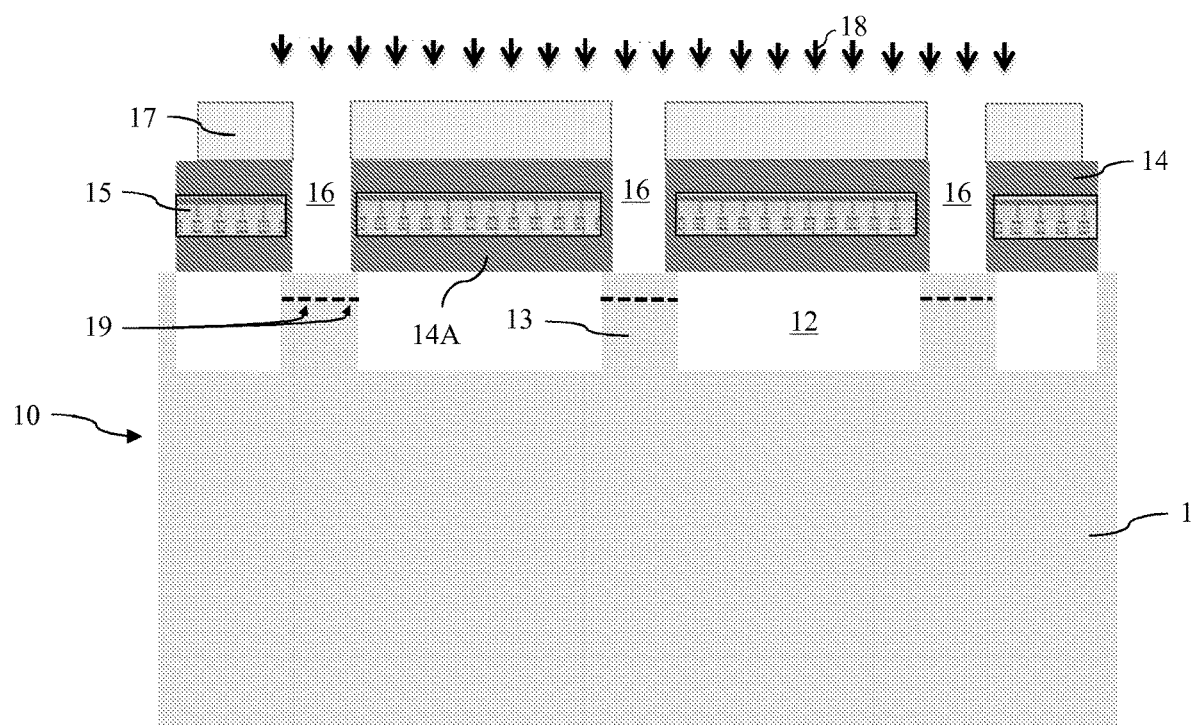
FIG. 12 is a schematic view of the donor substrate illustrating, according to one embodiment, the carrying out of etching to selectively remove portions of the active layer located plumb with the partitions, then the implantation of atomic species in the etched substrate.

According to one embodiment represented in FIG. 12, a selective etching of the active layer 14 is carried out in order to remove portions of active layers located plumb with the partitions. This etching is carried out prior to the formation of the weakened zones in the partitions by implantation of atomic species.

Such a selective etching makes it possible to make the partitions more accessible to the incident flux and improves the implantation of the atomic species in the partitions and also the feasibility of the fracturing of the partitions during the detachment of the donor substrate. Specifically, the atomic species thus penetrate into the substrate by the hollowed out portions 23 located plumb with the partitions 13, without passing through the active layer 14.

This embodiment is particularly advantageous when the active layer has a sizeable thickness, i.e., of from 1 μm (micrometer) to a few micrometers, which has a tendency to limit the implantation. Owing to these recesses, the implantation of the atomic species is no longer limited by the thickness of the active layer.

Figure 13:
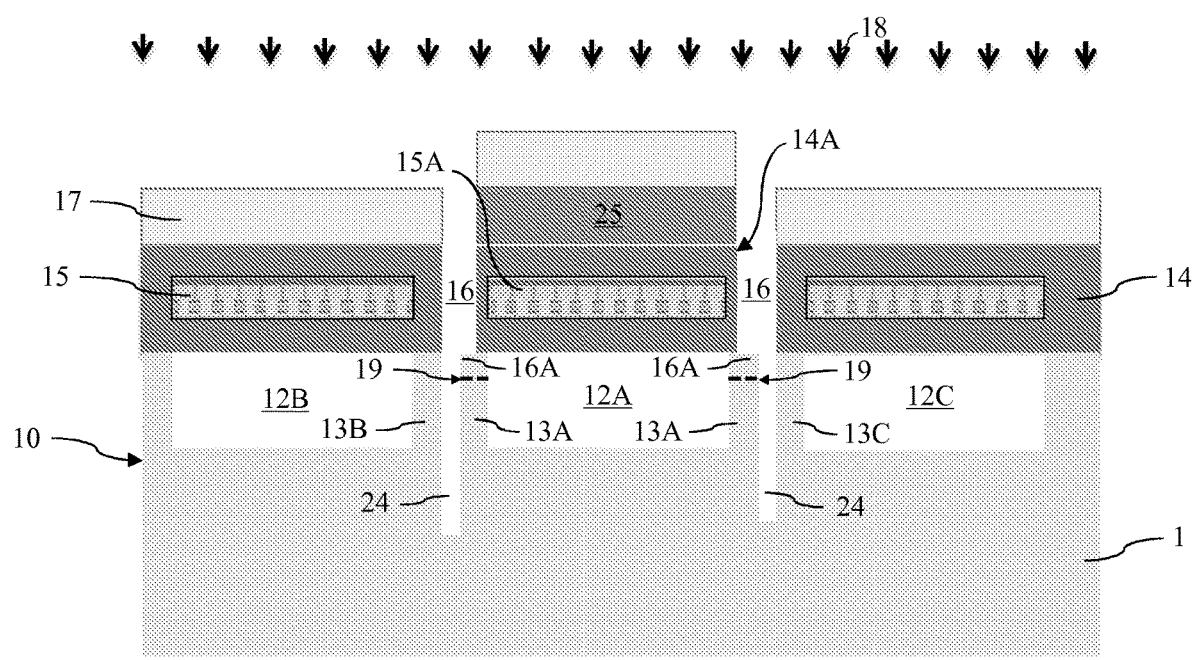
FIG. 13 is a schematic view of the donor substrate illustrating, according to one embodiment, the creation of trenches in the partitions after selective etching, for the subsequent selective transfer of a given electronic device of the active layer.

According to one embodiment represented in FIG. 13, trenches 24 are additionally made in at least one portion of the partitions 13, prior to the formation of the weakened zones in the partitions.

The trenches 24 extend into the thickness of the substrate beyond the cavities 12, i.e., more deeply than the cavities.

The trenches 24 make it possible to isolate a given cavity, and therefore, in particular, a given electronic device located plumb with the cavity, in order to subsequently enable the selective transfer thereof to the receiver substrate.

A trench 24 separates a partition into two portions 13A, 13B, of which a first portion delimits a first cavity 12A plumb with which is an electronic device, and a second portion delimits a second cavity 12B adjacent to the first cavity, plumb with which is another electronic device.

The trenches are made all around the portion of active layer to be transferred, in the corresponding partitions. For example, in the case of a cubic cavity such as the cavities 12A, 12B, and 12C, the cavity is delimited by four partitions, and each of the partitions is pierced by a trench.

With reference to FIG. 13, trenches 24 are made in the partitions 13, which delimit the cavity 12A, plumb with which is the portion 14A of active layer to be transferred with its electronic device 15A. Only two trenches are represented in FIG. 13 since the two other partitions that delimit the cavity 12A are not visible in FIG. 13.

The partition portions 13A that delimit the cavity 12A of active layer to be transferred protrude laterally from the active layer portion, the protrusion being captioned by the reference 16A in FIG. 13, and are partially aligned with the previously etched active layer portions.

The other partition portions 13B, 13C, which delimit active layer portions 14B, 14C adjacent to the active layer portion 14A to be transferred, do not themselves protrude from their respective active layer portion 14B, 14C.

Thus, during the step of implanting the atomic species, the partition portions 13A that delimit the active layer portion 14A to be transferred are exposed to the incident flux. The atomic species are then implanted in the exposed partition portions.

The other partition portions 13B, 13C, which delimit active layer portions 14B, 14C adjacent to the active layer portion to be transferred, are not themselves exposed to the incident flux, so that the atomic species are not implanted therein.

Thus weakened zones 19 are formed in each of the partition portions delimiting the active layer portion 14A to be transferred.

Next, the donor substrate is bonded to the receiver substrate, then the given active layer portion 14A is detached along the weakened zones 19 of the partition portions 13A, which makes it possible to selectively transfer the active layer portion 14A to the receiver substrate, while the rest of the active layer 14 remains on the donor substrate.

The description of this selective transfer given with reference to FIG. 13 relates to the transfer of a single portion of active layer. It should however be understood that several given portions of active layer may be transferred selectively, by carrying out one or more successive transfers, in order to transfer the desired electronic devices to the receiver substrate, or to several different receiver substrates using the same donor substrate.

According to one preferred embodiment, an additional layer of excess thickness 25 is deposited on the active layer portion 14A to be transferred, prior to the deposition of the protective mask, in order to form an excess thickness. The additional layer then lies between the active layer portion and the protective mask.

After removal of the mask, and optionally deposition of an oxide layer on the active layer and surface treatment, preferably by CMP, the active layer portion 14A with excess thickness 25 is transferred to the receiver substrate 30.

The formation of an excess thickness 25 makes it possible to further individualize the active layer portion(s) to be transferred, and thus to simplify the transfer thereof. Specifically, during the bonding, only the raised active layer portions come into contact with the receiver substrate. A simple detachment of the donor substrate by fracturing of the corresponding partition portions makes it possible to transfer the desired electronic devices to the receiver substrate, while the other active layer portions remain at a distance from the receiver substrate, and remain on the donor substrate.

It is then possible to deposit an additional layer on one or more of the remaining active layer portions on the donor substrate in order to form excess thicknesses, so as to transfer the remaining portions to another receiver substrate.

The process described therefore makes it possible to selectively transfer electronic devices from a donor substrate to one or more different receiver substrates, by reusing the same donor substrate.

The invention claimed is:

1. A process for fabricating a donor substrate for the production of a three-dimensional integrated structure, comprising:
    providing a semiconductor substrate comprising an active surface layer and a layer comprising a plurality of cavities extending beneath the active surface layer, each cavity being separated from an adjacent cavity by a partition;

forming an electronic device in a region of the active surface layer located plumb with a cavity, of the plurality of cavities;

depositing a protective mask on the active surface layer so as to cover the electronic device while exposing a region of the active layer located plumb with each partition; and implanting atomic species through the regions of the active layer exposed by the mask to form a weakened zone in each partition.

2. A process for fabricating a three-dimensional integrated structure, formed of a stack of active layers provided with electronic devices, by transfer of a layer from a donor substrate to a receiver substrate, the process comprising:

fabricating the donor substrate by a process according to claim 1;

bonding the donor substrate to the receiver substrate, the surface of the donor substrate opposite the weakened zones relative to the active layer to be transferred being at the bonding interface, and detaching the donor substrate along the weakened zones to transfer at least one portion of the active layer to the receiver substrate.

3. The process of claim 2, further comprising, prior to implantation of atomic species to form a weakened zone in the partitions selectively etching the active layer to remove at least one portion of the active layer located plumb with a partition.

4. The process of claim 3, further comprising, prior to the implantation of atomic species to form a weakened zone in the partitions, forming trenches that extend in the partitions beyond the cavities to isolate at least one cavity from the other cavities.

5. The process of claim 4, further comprising, before the deposition of the protective mask, depositing an additional layer that forms an excess thickness on an active layer portion located plumb with the isolated cavity.

6. The process of claim 4, wherein the detachment of the donor substrate is carried out along the weakened zones formed by implantation of atomic species in partition parts resulting from the formation of the trenches, and the active layer portion located plumb with the isolated cavity is selectively transferred to the receiver substrate.

7. The process of claim 4, further comprising forming the semiconductor substrate by a method including:

producing a plurality of cavities at the surface of a substrate to form the layer comprising the cavities; and transferring the active layer to the substrate to seal the cavities.

8. The process of claim 7, further comprising forming the cavities by dry etching and/or wet etching.

9. The process of claim 7, wherein the cavities are hollow.

10. The process of claim 7, further comprising forming the cavities by an electrochemical treatment.

11. The process of claim 1, further comprising forming the cavities by a method including:

depositing a protective mask on a free surface of a substrate, the protective mask being positioned so as to make covered surface portions and uncovered surface portions;

implanting atomic species in the substrate plumb with the surface portions not covered by the protective mask and forming implantation zones by exposing the face of the substrate covered with the mask to an incident flux of atomic species; and carrying out a thermal annealing of the substrate to form cavities at the implantation zones.

12. The process of claim 1, wherein each cavity comprises a porous medium having a porosity greater than or equal to 20% relative to the total volume of the cavity.

13. The process of claim 7, further comprising transferring the active layer to the cavity-containing layer by method including:

implanting atomic species to form a weakened zone in a second donor substrate made of semiconductor material to delimit a layer of semiconductor material to be transferred;

bonding the second donor substrate to the cavity-containing layer of the donor substrate, the surface of the layer to be transferred opposite the weakened zone relative to the layer to be transferred being at the bonding interface; and detaching the second donor substrate along the weakened zone to transfer the layer of semiconductor material to the substrate.

14. The process of claim 1, further comprising, prior to implantation of atomic species to form a weakened zone in the partitions, selectively etching the active layer to remove at least one portion of the active layer located plumb with a partition.

15. The process of claim 14, further comprising, prior to the implantation of atomic species to form a weakened zone in the partitions, forming trenches that extend in the partitions beyond the cavities to isolate at least one cavity from the other cavities.

16. The process of claim 15, further comprising, before the deposition of the protective mask, depositing an additional layer that forms an excess thickness on an active layer portion located plumb with the isolated cavity.

17. The process of claim 16, wherein the detachment of the donor substrate is carried out along the weakened zones formed by implantation of atomic species in partition parts resulting from the formation of the trenches, and the active layer portion located plumb with the isolated cavity is selectively transferred to a receiver substrate.

18. The process of claim 1, further comprising forming the semiconductor substrate by a method including:

producing a plurality of cavities at the surface of a substrate to form the layer comprising the cavities; and transferring the active layer to the substrate to seal the cavities.

19. The process of claim 1, wherein the cavities are hollow.

20. A donor substrate comprising an active layer to be transferred to a receiver substrate, comprising:

a layer comprising cavities, which extend in the thickness of the donor substrate and which are delimited by partitions;

an active layer located on the cavity-containing layer, the active layer comprising at least one electronic device, each electronic device being arranged in a region of the active layer located plumb with a cavity; and weakened zones in at least one part of the partitions separating the cavities.

* * * * *

UNITED STATES PATENT AND TRADEMARK OFFICE
CERTIFICATE OF CORRECTION

PATENT NO.        : 11,239,108 B2
APPLICATION NO.   : 17/043480
DATED             : February 1, 2022
INVENTOR(S)       : Gweltaz Gaudin, Didier Landru and Bruno Ghyselen Page 1 of 1

It is certified that error appears in the above-identified patent and that said Letters Patent is hereby corrected as shown below:

In the Specification
    Column 7,    Lines 46-47,    change "the surface" to --the exposed--
    Column 8,    Line 50,    change "portions" to --surface portions--

In the Claims
Claim 3,    Column 13,    Line 26,    change "partitions" to --partitions,--
Claim 13,    Column 14,    Line 11,    change "method" to --a method--

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*